US008611548B2

(12) United States Patent
Bizjak

(10) Patent No.: US 8,611,548 B2
(45) Date of Patent: Dec. 17, 2013

(54) NOISE ANALYSIS AND EXTRACTION SYSTEMS AND METHODS

(76) Inventor: Karl M. Bizjak, Orinda, CA (US)

( * ) Notice: Subject to any disclaimer, the term of this patent is extended or adjusted under 35 U.S.C. 154(b) by 0 days.

(21) Appl. No.: 13/556,150

(22) Filed: Jul. 23, 2012

(65) Prior Publication Data

US 2012/0288106 A1 Nov. 15, 2012

Related U.S. Application Data

(63) Continuation of application No. 12/018,765, filed on Jan. 23, 2008, now Pat. No. 8,249,271.

(60) Provisional application No. 60/886,290, filed on Jan. 23, 2007.

(51) Int. Cl.
*H03G 3/20* (2006.01)

(52) U.S. Cl.
USPC ............................ 381/57; 381/94.1; 381/107

(58) Field of Classification Search
USPC .................................. 381/57, 94.1, 104, 107
See application file for complete search history.

(56) References Cited

U.S. PATENT DOCUMENTS

| | | | |
|---|---|---|---|
| 3,701,028 | A | 10/1972 | Markevich |
| 3,789,143 | A | 1/1974 | Blackmer |
| 4,169,219 | A | 9/1979 | Beard |
| 4,216,427 | A | 8/1980 | Bethards |
| 4,249,042 | A | 2/1981 | Orban |
| 4,306,115 | A | 12/1981 | Humphrey |
| 4,306,202 | A | 12/1981 | Schroeder |
| 4,322,579 | A | 3/1982 | Kleis et al. |
| 4,368,435 | A | 1/1983 | Bloy |
| 4,482,973 | A | 11/1984 | Unagami et al. |
| 4,553,257 | A | 11/1985 | Mori et al. |
| 4,558,460 | A | 12/1985 | Tanaka et al. |
| 4,562,591 | A | 12/1985 | Stikvoort |
| 4,628,526 | A | 12/1986 | Germer |
| 4,641,361 | A | 2/1987 | Rosback |
| 4,853,963 | A | 8/1989 | Bloy et al. |
| 4,859,964 | A | 8/1989 | Jorgensen |
| 4,868,881 | A | 9/1989 | Zwicker et al. |
| 4,882,762 | A | 11/1989 | Waldhauer |
| 4,887,299 | A | 12/1989 | Cummins et al. |
| 4,891,837 | A | 1/1990 | Walker et al. |
| 4,941,187 | A | 7/1990 | Slater |
| 4,947,133 | A | 8/1990 | Thomas |

(Continued)

FOREIGN PATENT DOCUMENTS

DE 19624092 B4 4/2006

OTHER PUBLICATIONS

Applicant's admitted prior art, Figures 1A-1E, Figure 2, pp. 2-11.

*Primary Examiner* — Minh-Loan T Tran
(74) *Attorney, Agent, or Firm* — Loza & Loza, LLP; Anthony G. Smyth

(57) ABSTRACT

Systems and methods are described which facilitate quick and accurate extraction of the true noise level from a noise signal that includes additional signals, such as speech, in a cost effective implementation. Aspects of the invention allow the use of one microphone to simultaneously detect background noise as well as speech, while avoiding problems associated with artificially high background noise indication due to inclusion of the speech component in the noise determination. Additionally, systems and methods are described for altering system gain based on accurate noise level determinations.

19 Claims, 12 Drawing Sheets

(56) References Cited

U.S. PATENT DOCUMENTS

| | | | |
|---|---|---|---|
| 4,953,221 | A | 8/1990 | Holly et al. |
| 4,956,867 | A | 9/1990 | Zurek et al. |
| 4,972,164 | A | 11/1990 | Akagiri et al. |
| 5,027,410 | A | 6/1991 | Williamson et al. |
| 5,107,539 | A | 4/1992 | Kato et al. |
| 5,172,358 | A | 12/1992 | Kimura |
| 5,251,262 | A | 10/1993 | Suzuki et al. |
| 5,416,845 | A | 5/1995 | Qun |
| 5,426,703 | A | 6/1995 | Hamabe et al. |
| 5,434,922 | A | 7/1995 | Miller et al. |
| 5,444,788 | A | 8/1995 | Orban |
| 5,450,494 | A | 9/1995 | Okubo et al. |
| 5,463,695 | A | 10/1995 | Werrbach |
| 5,509,081 | A | 4/1996 | Kuusama |
| 5,530,761 | A | 6/1996 | D'Alayer de Costemore |
| 5,550,922 | A | 8/1996 | Becker |
| 5,615,270 | A | 3/1997 | Miller et al. |
| 5,631,968 | A | 5/1997 | Frey et al. |
| 5,666,426 | A | 9/1997 | Helms |
| 5,832,097 | A | 11/1998 | Armstrong et al. |
| 6,072,884 | A | 6/2000 | Kates |
| 6,151,400 | A | 11/2000 | Seligman |
| 6,519,559 | B1 | 2/2003 | Sirivara |
| 6,799,161 | B2 | 9/2004 | Yokoyama |
| 8,085,943 | B2 * | 12/2011 | Bizjak ........................ 381/71.14 |

* cited by examiner

NOISE ANALYSIS AND EXTRACTION SYSTEMS AND METHODS

CROSS-REFERENCE TO RELATED APPLICATION(S)

This is a Continuation application which claims the benefit of pending U.S. patent application Ser. No. 12/018,765, entitled "Noise Analysis and Extraction Systems and Methods," filed on Jan. 23, 2008, which claims the benefit of U.S. Provisional Patent Application No. 60/886,290, entitled "System and Method for Analysis of Noise Extractor," filed on Jan. 23, 2007; the application is also related to pending U.S. Pat. No. 8,085,943, entitled "Noise Extractor System and Method," issued Dec. 27, 2011, which are all expressly incorporated by reference herein in their entirety.

BACKGROUND OF THE INVENTION

1. Field of the Invention

The present invention relates generally to noise detection and more particularly to systems and methods of compensating for noise.

2. Description of Related Art

Conventional noise detectors and audio noise compensation systems suffer from a variety of limitations. A primary limitation is a slow, inaccurate and/or costly noise detector. FIG. 1 shows a conventional noise detector in which microphone 100 detects the acoustic noise signal which is amplified and provided to power estimator 120 to produce an environmental noise level 130. Power estimator 120 typically consists of a rectifier and lowpass filter. When used in an application such as a phone, the caller's speech dominates the microphone signal resulting in an erroneous higher noise level indication.

For systems that increase system output volume in response to noise, the effect of the caller's speech results in the output level increasing every time the caller speaks then decreasing when the caller ceases speaking. To reduce this undesirable behavior, the attack time of power estimator 120 is reduced in an attempt to avoid responding to the caller's speech. However, this results in unacceptably slow response times and it may well be faster to manually adjust the volume level.

To increase the response time, multiple microphones have been used, one to detect mainly the caller's voice and a second to detect mainly the background noise level. The microphones need to be matched and as the microphones age, they become mismatched resulting in degraded operation. There is also an additional cost for matched microphones. An alternative is to perform a "matching operation" every time the device is operated. Another alternative is to have a "bone conduction microphone" detect the caller's voice for removal from the main microphone signal. This requires the bone conduction microphone to be in contact with the caller's skin, which can be uncomfortable for long durations. The contact quality is also affected by the caller's mouth movements which alters the amount of skin contact pressure.

BRIEF SUMMARY OF THE INVENTION

Certain embodiments of the present invention comprise systems and methods for analysis of noise extraction and noise extractors which substantially overcome the limitations of the prior art, including those described above. Quick, accurate noise levels can be obtained with a single microphone, resulting in cost effective implementations which range from microphones for use in recording, to wireless phones and personal media players.

In certain embodiments, systems and methods use a novel noise filter arrangement in combination with a statistics generator and analyzer to analyze a noise power level histogram and discriminate between the actual noise level and additional signals, such as speech. In certain embodiments, a quick and accurate noise level measurement and estimation can be obtained. In certain embodiments, systems and methods for compensating for the noise component operate by further processing noise level measurements to provide control signals to system gain elements, including volume controls and compander.

DETAILED DESCRIPTION OF THE INVENTION

Embodiments of the present invention will now be described in detail with reference to the drawings, which are provided as illustrative examples so as to enable those skilled in the art to practice the invention. Notably, the figures and examples below are not meant to limit the scope of the present invention to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the components referred to herein by way of illustration.

Figure 1:
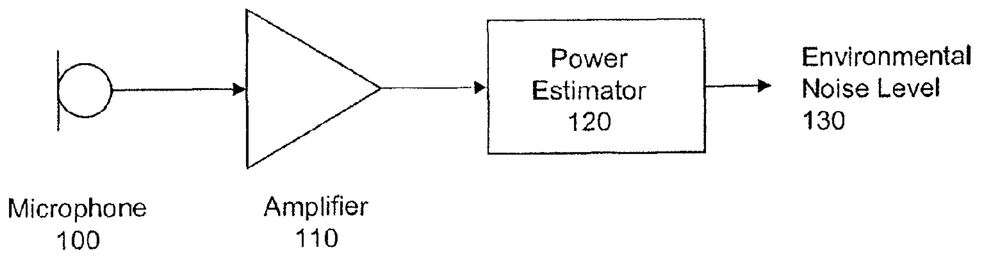
PRIOR ART FIG. 1
FIG. 1 shows a prior art noise level detector.
Figure 2:
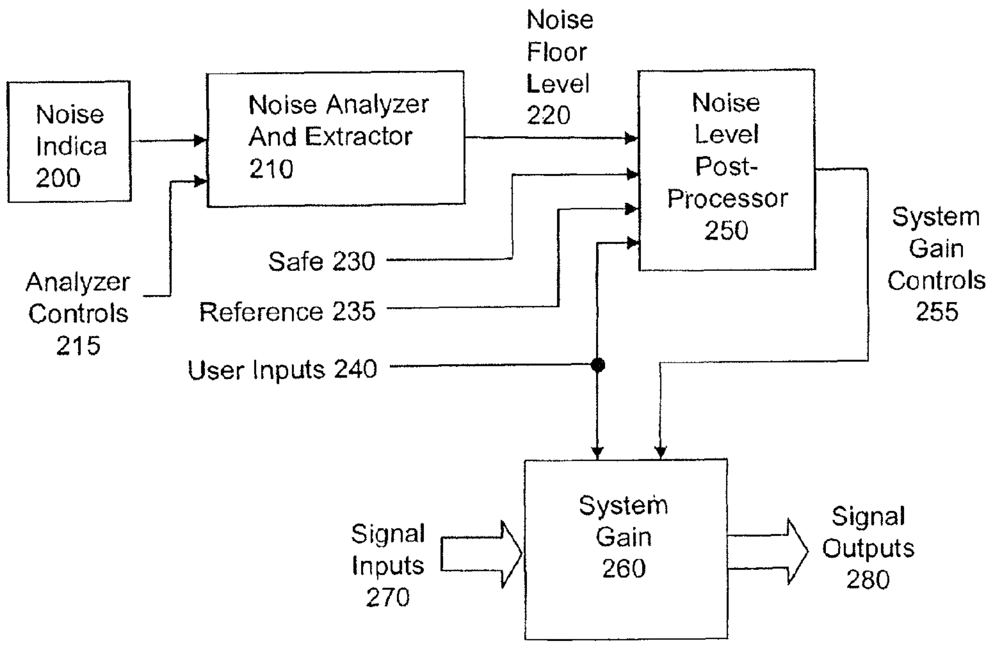
FIG. 2 shows a top level block diagram in accordance with the present invention.
Figure 3:
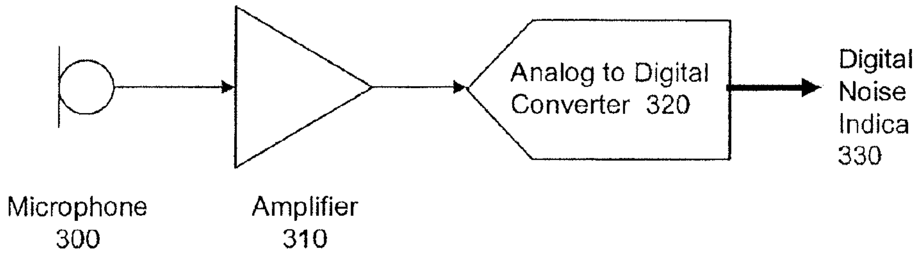
FIG. 3 shows an example of Noise Indica.

With reference to the example depicted in FIGS. 2 and 3, various aspects of the overall system and process flow of the present invention can be appreciated. The illustrated system can be seen, in broadest form, to be comprised of four main blocks. Noise Indica 200 typically comprises an amplified microphone. As shown in FIG. 3, an output of microphone 300 is amplified by amplifier 310 which feeds an analog to digital converter 320 that produces Digital Noise Indica signal 330. In certain embodiments, digital noise indicia may comprise one or more alternative or additional components generated by devices such as a tachometer and/or accelerometer for relating speed or acceleration to noise level and/or a state indicator signal such as a windows up/down signal. In certain embodiments a combination of microphones, tachometers, accelerometers and state indicators may be selected based on application or user selection. Certain devices may generate digital signals directly and inputs from these devices may bypass analog-to-digital conversion stage 320. In one example, a tachometer converter may count revolutions per unit time and supply a digital count value.

Noise indicia 200 provide an output to noise analyzer and extractor 210, details of which will be discussed later in connection with FIG. 4. The noise floor level 220 can be extracted by analyzing an accumulated history of noise power estimates of the noise indicia, which may be in the form of a histogram and provided to noise level post-processor 250. While the accumulated history of noise power estimates for a stable, constant noise source can be straightforward to analyze, the noise signal is often mixed with speech, clicks and pops from buttons, click wheels and disk drives and short term transient noise, which can make analysis more difficult. The analyzer 210 may seek trends or patterns in the accumulated history data to determine what produced those trends or patterns, the noise component in particular. Analyzer controls 215 can include system level functions such as histogram table reset (e.g. set all histogram bins to zero) or time_limit_reached histogram data pruning to prevent histogram bin overflow.

Noise level post-processor 250 receives noise floor level 220, "Safe" signal 230, reference signal 235, and user inputs 240 and typically converts the noise floor level into System Gain Control 255 output signals for use by system gain block 260. System gain controls 255 typically comprise one or more volume levels or volume level offsets, compander kneepoints, compander compression/expansion ratio settings, levels and offsets. The transform engine of U.S. patent application Ser. No. 09/728,215 is an example of such post-processing. In addition, variable attack and release modules may be used to further process noise floor level 220 to produce a desired "delay, converge, slow response" noise floor level response to changes in the noise level (as described in U.S. patent application Ser. No. 09/728,215 and U.S. Pat. No. 7,212,640) or the same type of response for volume level offsets and/or compander operating parameters. The delay response can prevent overly-quick response to transient noises such as a door slamming or short cessations of noise (i.e. drop out). If a change in noise level persists longer than the selected delay, the change is most likely a valid noise level change and a quick convergence on the new noise level along with any noise compensation may be obtained, typically in a non-linear manner. A non-linear response is often desirable because the ear responds to sound in a non-linear manner. Upon convergence of the response on the new noise level, signal distortion may be minimized through the use of a slow response, such as can be obtained by a conventional low-pass filter.

A reference signal 235 may also be used to determine system gain control settings. The reference signal 235 represents a power estimate of signal outputs 280 and is typically compared to the noise floor level to determine if the noise floor level is of a sufficient magnitude to require noise compensation of signal outputs 280 as described in related U.S. patent application Ser. No. 09/728,215. This allows noise compensation to become active when the noise floor level is low (when noise compensation is typically not required) and signal inputs 270 become quiet, such as when characters in a movie scene are whispering. However, most popular music, television shows, talk radio, and phone conversation are of very limited dynamic range, and a fixed value for the reference signal or no reference signal at all may be used, resulting in a more cost effective product.

User inputs can include output volume settings, compander gain curve selection, and a sensitivity control to adjust the signal to noise ratio of the system, also described in U.S. patent application Ser. No. 09/728,215. The Safe signal 230 may be used to force the system gain controls 255 into a state that causes system gain block 260 to restrict signal outputs 280 to levels calculated to avoid long-term hearing damage. The Safe signal 230 may be generated by a system timer or by a statistics generator and analyzer (as described in related U.S. Pat. No. 6,675,125) that monitors the levels of signal outputs 280 over a predefined sliding time interval. If the accumulated output level exposure exceeds a limit, Safe signal 230 can be activated to reduce the output level to a safe long term listening level until the listener's ears have had an opportunity to recover. Signal inputs 270 and gain values in system gain controls 255 can alternatively be monitored by the statistics generator and analyzer that generates the Safe signal.

In the illustrated embodiments, System Gain block 260 receives System Gain Controls 255, User Inputs 240, and Signal Inputs 270 and typically includes one or more volume controls, companders, or combinations of volume controls and companders.

Figure 4:
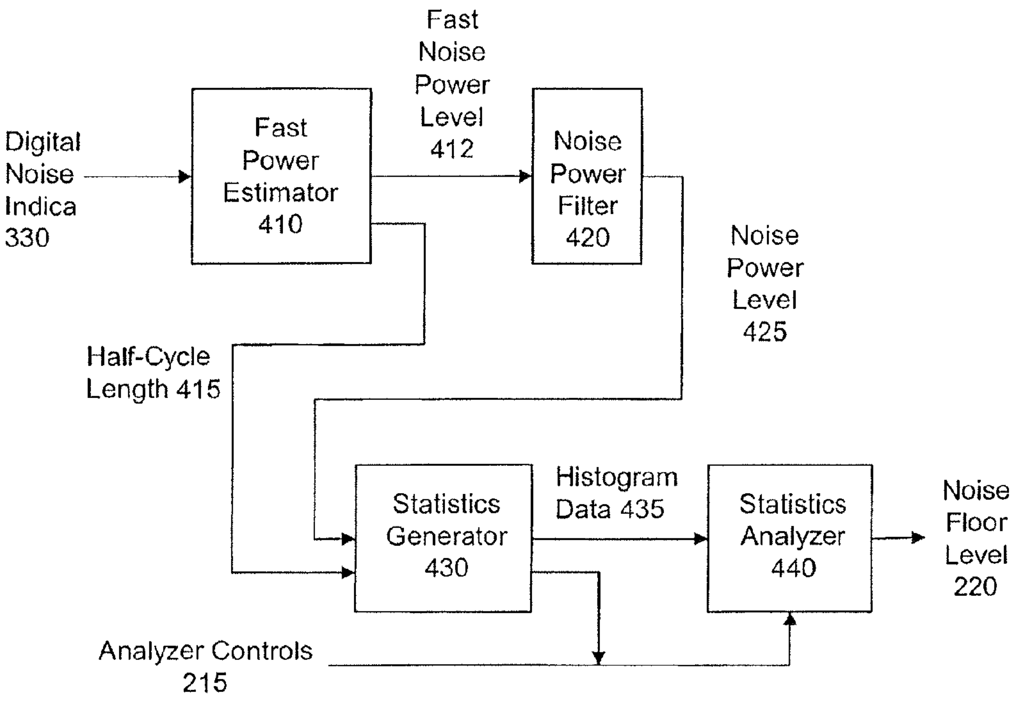
FIG. 4 shows a block diagram of a Noise Analyzer and Extractor in accordance with the present invention.

Turning now to FIG. 4, the operation of noise analyzer and extractor 210 may be appreciated. As depicted, digital noise indica 330 are provided to fast power estimator 410 which rectifies the signal and produces a fast noise power level 412. Typically, RMS, average, or peak detectors are used. However, better performance can be obtained by using half-cycle and initial power estimators (as described in related U.S. patent application Ser. No. 09/726,983) which can provide the fastest changing output without amplitude ripple. It will be appreciated that half-cycle length signal 415 is output when half-cycle and initial power estimators are used.

Noise Power Filter 420 receives fast noise power level 412 and produces noise power level 425. The filter is typically configured as a slow-attack/fast-release filter which is typically the optimal filter for tracking noise levels because other signal components in the noise signal, such as speech, are typically louder than the noise floor. These other signal components, besides speech, include disk drive mechanical noise and audible sounds from button presses and click wheels. It will be appreciated that the latterly listed components are typical of components associated with personal media players and, although the components produce low level noise, close proximity to the sensing microphone in a typical small media player can result in a disproportionate effect and result in noise floor errors. "Head thumps" can also be problematic; head thumps may be produced by a microphone during running where the microphone receives a high-G shock during every step. Although head thumps are generally low-frequency noise, they can have large amplitudes. The use of a slow-attack/fast-release filter can result in histograms that emphasize the noise floor and spread out the other signal components so they are not as prominent. It will be appreciated that the variable attack and release module described in U.S. Pat. No. 7,212,640 may be used to provide a variable slow attack/fast release filter.

In the example depicted, statistic generator 430 receives noise power level 425 and, if half-cycle and initial power estimators are used, half-cycle length 415, and builds and/or accumulates a history of received noise power levels 425. In certain embodiments, the accumulated noise power levels 425 may be organized into a histogram associated with the received and accumulated noise power levels 425, details of which will be discussed later in connection with FIG. 5. As outputs, histogram data 435 and analyzer controls 215 can be provided wherein the analyzer controls 215 typically include a count_limit_reach flag used by statistics analyzer 440 to prune the histogram to prevent histogram bin overflow and provide for data decay. Certain embodiments of the invention employ statistics generator and analyzer modules similar to those described in related U.S. Pat. No. 6,675,125.

In the illustrated embodiments, statistics analyzer 440 receives and analyzes the histogram data 435 to determine noise floor level 220, as will be discussed in more detail below with regard to FIGS. 9-14. Analyzer controls 215 are also typically received and/or monitored. These control signals may be used to reset the histogram data (to zero) and to provide a histogram data decay mechanism, which can also prevent histogram bin data overflow as will be discussed in more detail below in connection with FIG. 8.

Figure 5:
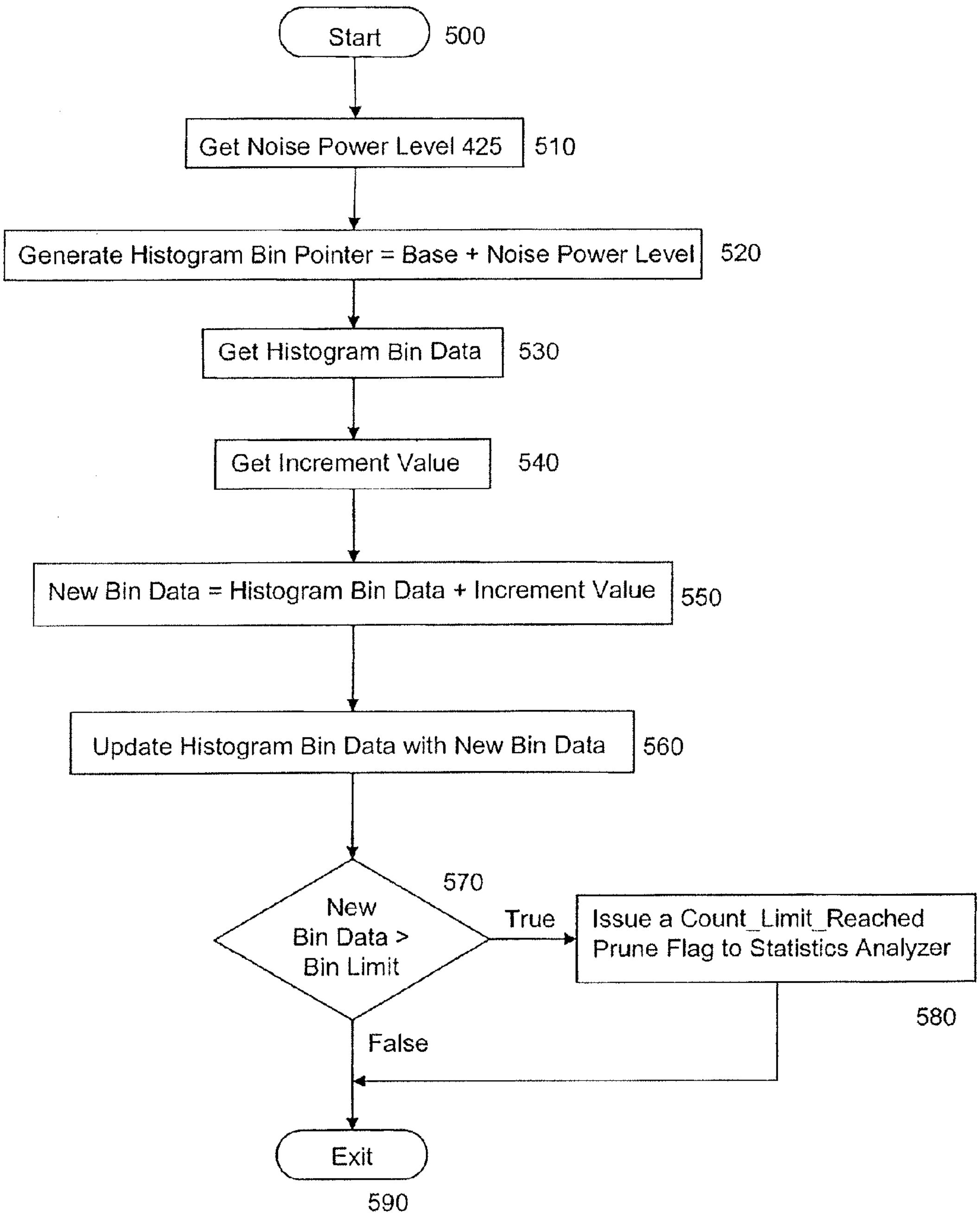
FIG. 5 shows a detailed exemplary Statistics Generator flow diagram.
Figure 6:
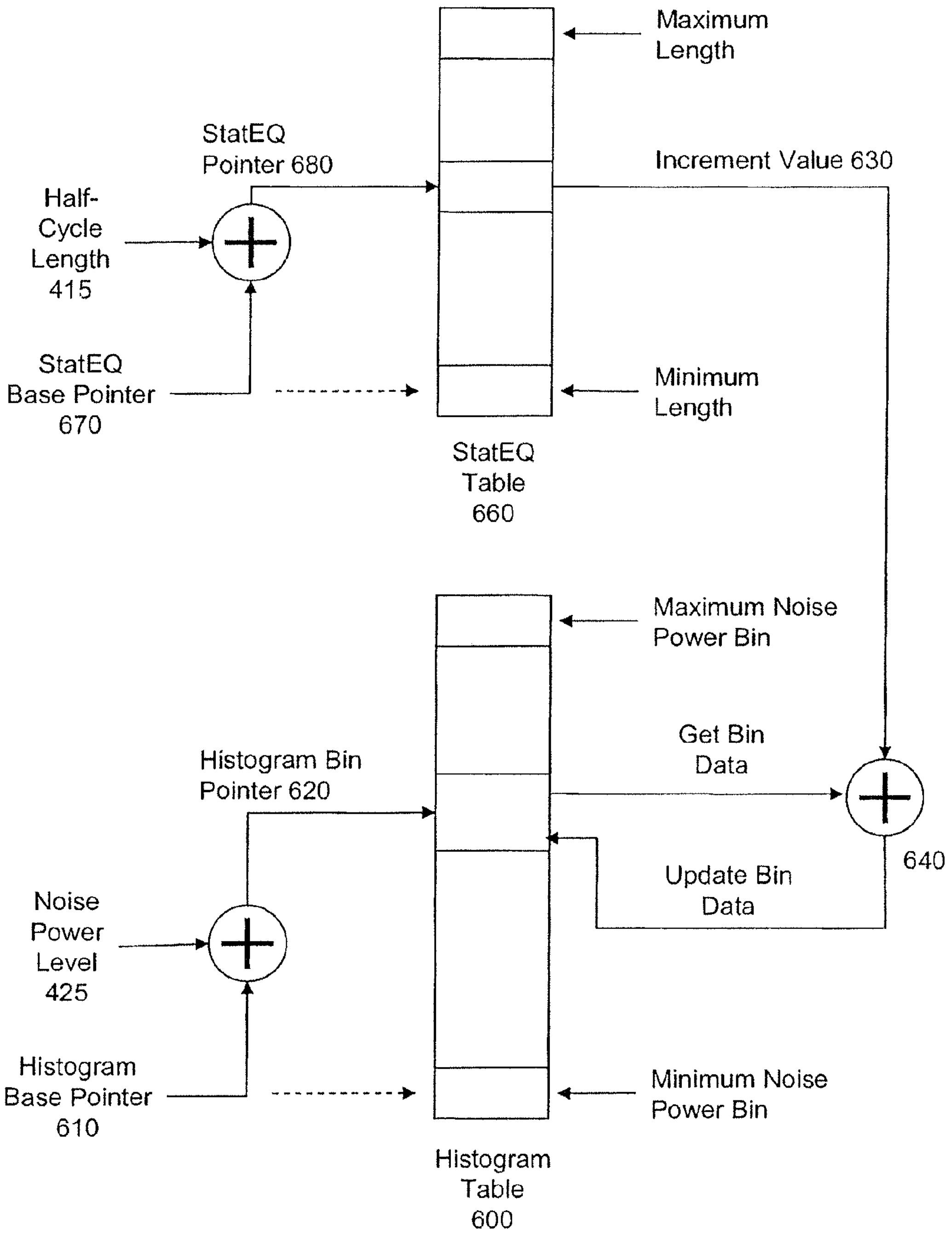
FIG. 6 is an exemplary histogram generator with spectral equalization.

Referring to FIGS. 5 and 6, certain aspects of operation of the statistics generator 430 will now be described. The process begins at step 500 and proceeds through step 530 where the noise power level 425 is combined with a histogram table base value to generate the histogram bin pointer to access the appropriate histogram bin data. An example is shown in FIG. 6 as histogram base pointer 610 added to noise power level 425 producing histogram bin pointer 620, which reads the appropriate bin data and supplies it to adder 640.

The get increment value step 540 may comprise a simple step or process but, in certain embodiments, may include complicated processes according to the type of fast power estimator 410 used. If an RMS, average, or peak detector is used, a fixed increment value, typically equal to 1, can be used since the outputs of such power estimators are sampled at the same rate regardless of the input frequency. If half-cycle and initial power estimators are used, then the increment value will typically depend on the half-cycle length (or frequency) of digital noise indica 330. Lower frequencies occur less often than higher frequencies and, consequently, the histogram data will grow more slowly than with higher frequency inputs. Therefore, higher frequency signals are emphasized in the histogram data. For an equally weighted histogram result, spectral equalization must typically be built into the increment value. FIG. 6 shows an exemplary lookup table method for obtaining an appropriate increment value although the increment value may also be directly calculated. The increment values can be stored in StatEQ Table 660. The pointer to the appropriate increment value, StatEQ Pointer 680, may be derived by adding the half-cycle length 415 and the StatEQ base pointer 670. The increment value 630 is then provided to adder 640. Spectral equalization may also be used to emphasize certain frequencies, such as the higher frequencies associated with many soft speech sounds. In addition, the noise power level 425 may also be used to determine an increment value, for example, to de-emphasize the very low power levels that will not interfere with typical listening levels. Determining increment values using both spectral equalization and power levels is also contemplated.

The updated bin value from adder 640 is then stored back in the histogram table at the location indicated by histogram bin pointer 620. This is equivalent to steps 550 and 560 of the FIG. 5 flow diagram.

Eventually the histogram bin data will overflow from repeated addition. It is also desirable to have the old histogram data decay so more recent input data will have a greater influence. Steps 570 and 580 of FIG. 5 can prevent overflows and provide for data decay. The updated histogram bin data from step 550 may be tested in step 570 to determine if it is larger than a bin limit. If larger (i.e. "True"), then a Count_Limit_Reached flag can be sent to the statistical analyzer 440 to prune the histogram. The bin limit is typically selected to be less than the maximum value the bin will allow to accommodate response delays from the issuing of the Count_Limit_Reached flag to the actual pruning. The process ends at step 590.

Figure 7:
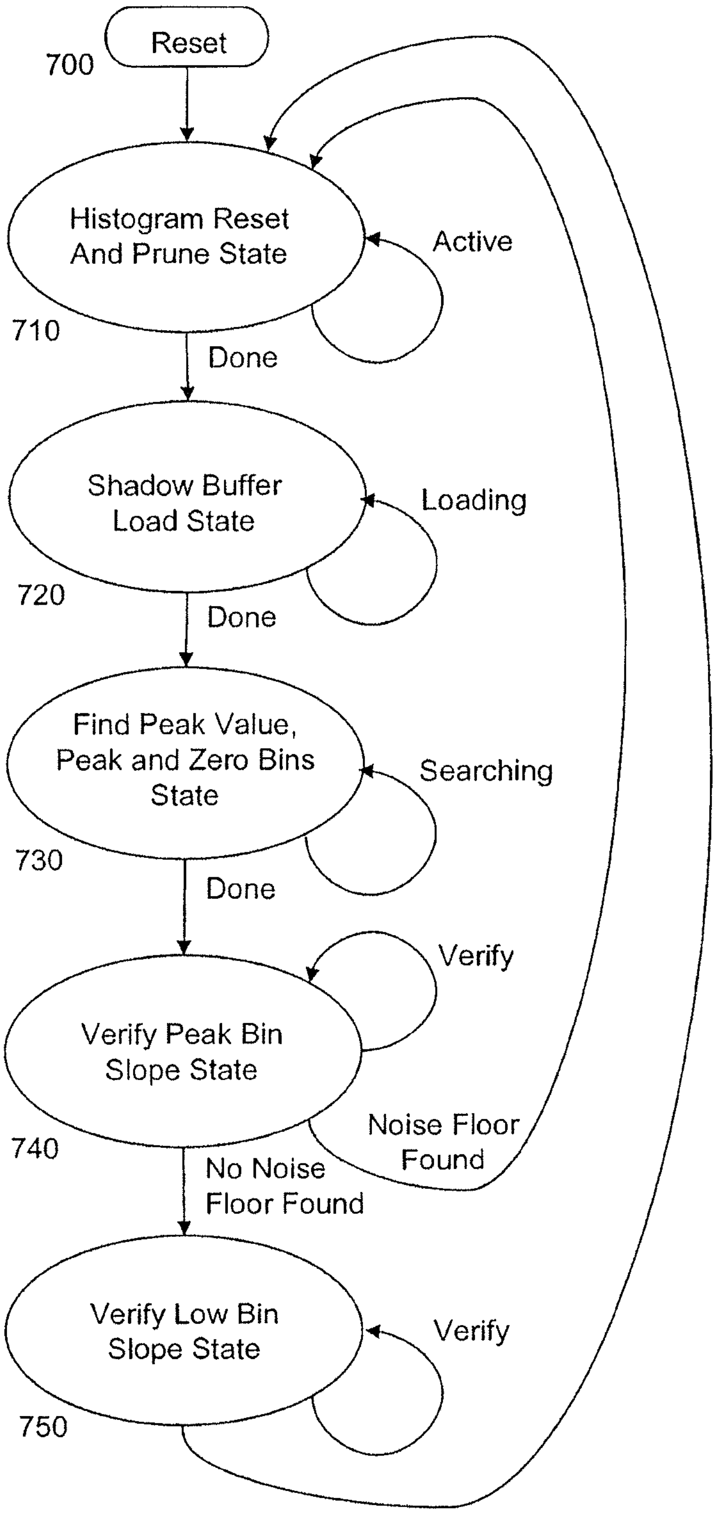
FIG. 7 shows one example of a high level Statistics Analyzer flow diagram.

The operation of an example of a statistics analyzer 440 is illustrated by the state diagram of FIG. 7. The process loop (steps 710 through 750) is typically entered from step 700 after a system or power-on reset. Step 710, the histogram reset and prune state, checks for reset and prune flags and resets or prunes if indicated to do so. When complete, the shadow buffer load state 720 is entered. While not required, it may be desirable to freeze the histogram data from statistics generator 430 in a shadow buffer such that a stable histogram can be analyzed while the statistics generator continues to update the main histogram. Once the shadow buffer is loaded, step 730, the find peak value, peak and zero bins state, is entered. This is the main analysis state and determines two possible noise floor bins.

Certain rare but potentially error inducing situations may occur that require verification of the two possible noise floors prior to selection of a noise floor. A "dominant talker" can create a major error-inducing situation; a dominant talker talks continuously for extended periods of time. This prolonged talking can distort the noise power level histogram, potentially resulting in an erroneous noise floor. For this reason, when step 730 is complete, step 740, the verify peak bin slope state, is typically entered. In this state, the histogram slope from the peak bin may be tested. A determination that the noise floor has been detected may be made if the slope is steep enough and noise floor level 220 can be updated. Subsequently, the next step will be either histogram reset and prune state 710 if the noise floor was found or the verify low bin slope state 750 if the noise floor was not found.

At step 750, the slope from the zero bin is tested. If the slope is steep enough, the noise floor can be determined to have been detected and noise floor level 220 can be updated. Otherwise, the noise floor has not been detected and noise floor level 220 is not updated, retaining the last valid noise floor level. Next, the histogram reset and prune state 710 can be entered.

Figure 8:
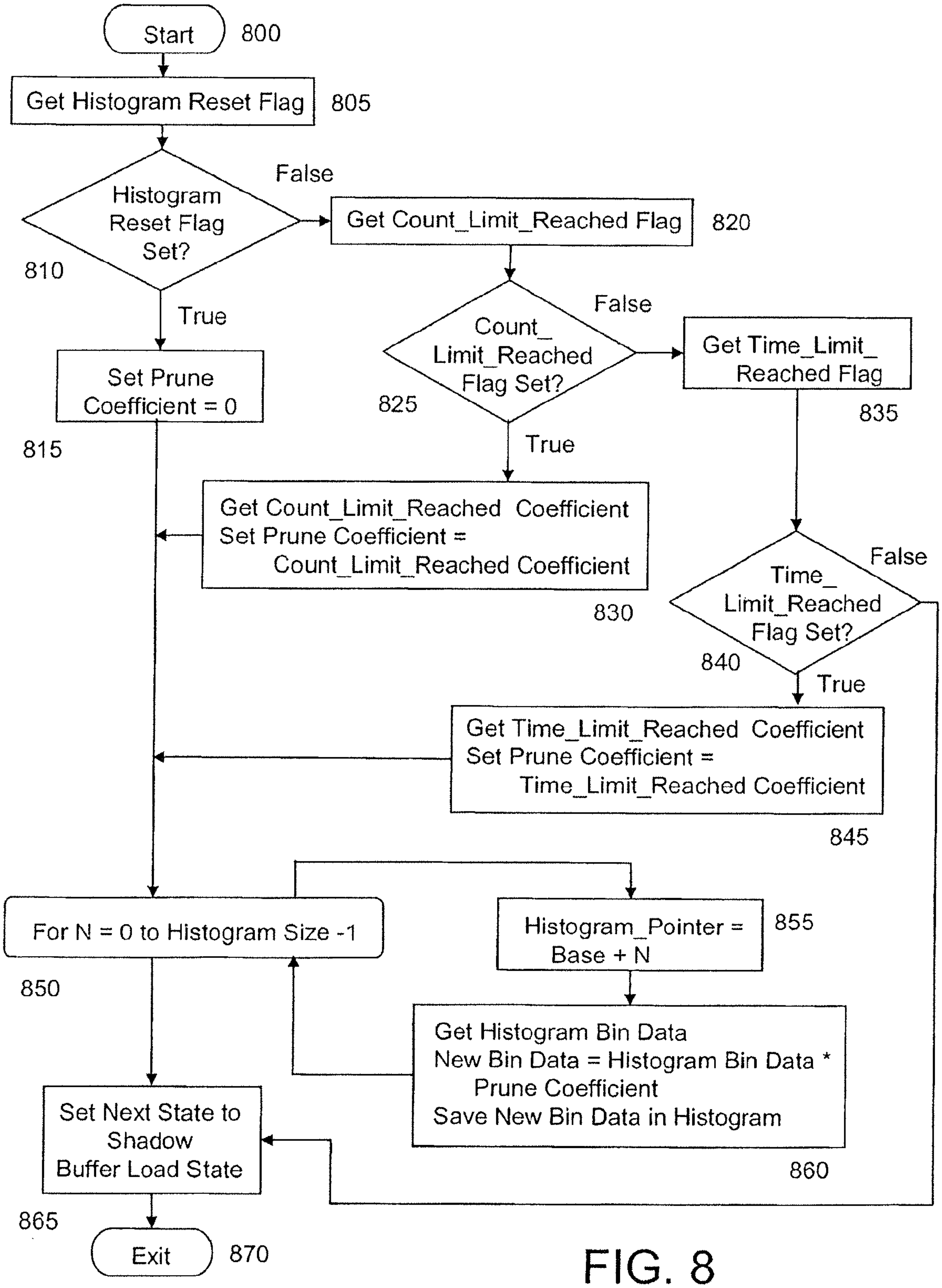
FIG. 8 shows a detailed exemplary Histogram Reset and Prune State flow diagram.

FIG. 8 depicts an example of histogram reset and prune state 710. First, the highest priority reset flag may be tested at step 810 and if True, the prune coefficient can be set to zero in step 815 to clear all histogram bins. If the test at step 810 results in a False signal, then the next highest priority flag, the Count_Limit_Reached Flag from statistics generator 430, may be tested at step 825 and if true, the prune coefficient can be set to the Count_Limit_Reached coefficient in step 830. If the test at step 825 results in a False signal, then the lowest priority flag, the Time_Limit_Reached Flag, may be tested at step 840 and if True, the prune coefficient can be set to the Time_Limit_Reached Coefficient in step 845. Otherwise, there is no reset or prune operation to perform, the process can advance to step 865, wherein the next state is set to Shadow Buffer Load State before exiting at step 870. If the prune coefficient was loaded in steps 815, 830, or 845, then at step 850 the histogram prune loop can be executed. The loop may comprise steps 855 and 860 in which each histogram bin is read, multiplied by the Prune Coefficient, and stored back in the histogram. When all histogram bins have been pruned, step 850 can terminate and the process may advance to step 865 where the next state is set to Shadow Buffer Load State prior to exiting at step 870.

Figure 9:
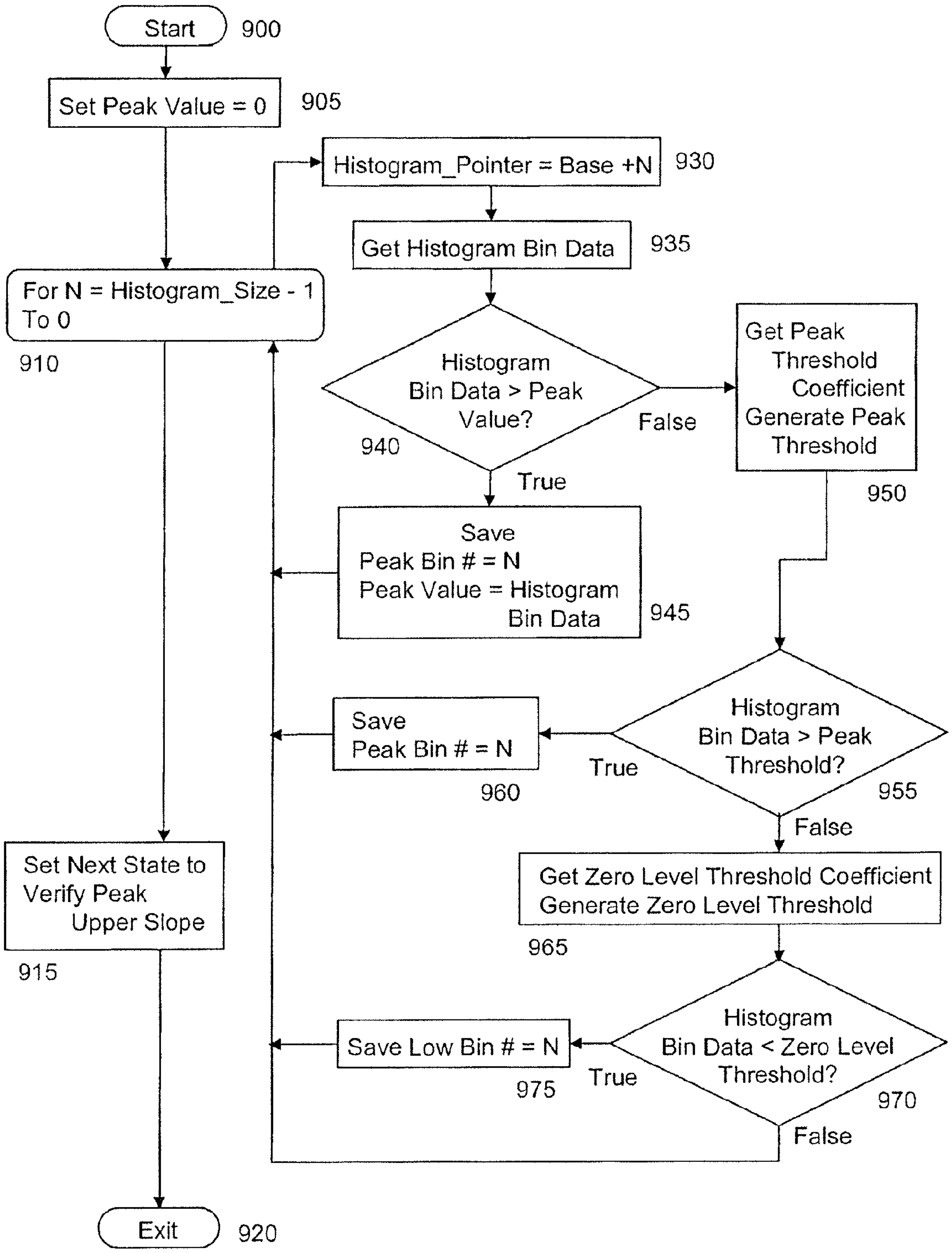
FIG. 9 shows a detailed exemplary Find Peak Value, Peak and Zero Bins State flow diagram.

In FIG. 9, an example of Find Peak Value, Peak and Zero Bins State 730 is illustrated. The process begins at step 900, initializes the Peak Value to zero in step 905, and enters the main analysis loop at step 910. The loop traverses the histogram bins from the highest Noise Power Level to the lowest as indicated in step 910 by the loop index N beginning at the (histogram size-1) and decreasing to zero. Next, at step 930, the Histogram_Pointer is generated from the histogram base and loop index N, which may be used in step 93S to retrieve the Histogram Bin Data. The Histogram Bin Data can then be tested against the Peak Value at step 940, and if higher, at step 945, the Histogram Bin Data may become the new Peak Value, loop index N may become the new Peak Bin #, and the process can return to step 910.

If the Histogram Bin Data is less than or equal to the Peak Value at step 940, then two additional tests may be performed on the Histogram Bin Data. At step 955, the Histogram Bin Data is tested to determine if it is greater than a Peak Threshold that was generated in step 950. If True ("greater"), the loop index N may be saved as the new Peak Bin # in step 960, and the process can return to step 910. Since the histogram may be relatively flat at the higher power levels, this determination will typically find the lowest power corner, which is most likely associated with the actual noise floor. If the test at step 955 was False, then at step 970 the Histogram Bin Data may be tested to determine if it is greater than a Zero Level Threshold that was generated in step 965. If True, the loop index N is saved as the new Low Bin # in step 975, and the process can return to step 910. If false a return to step 910 can occur.

Figure 10:
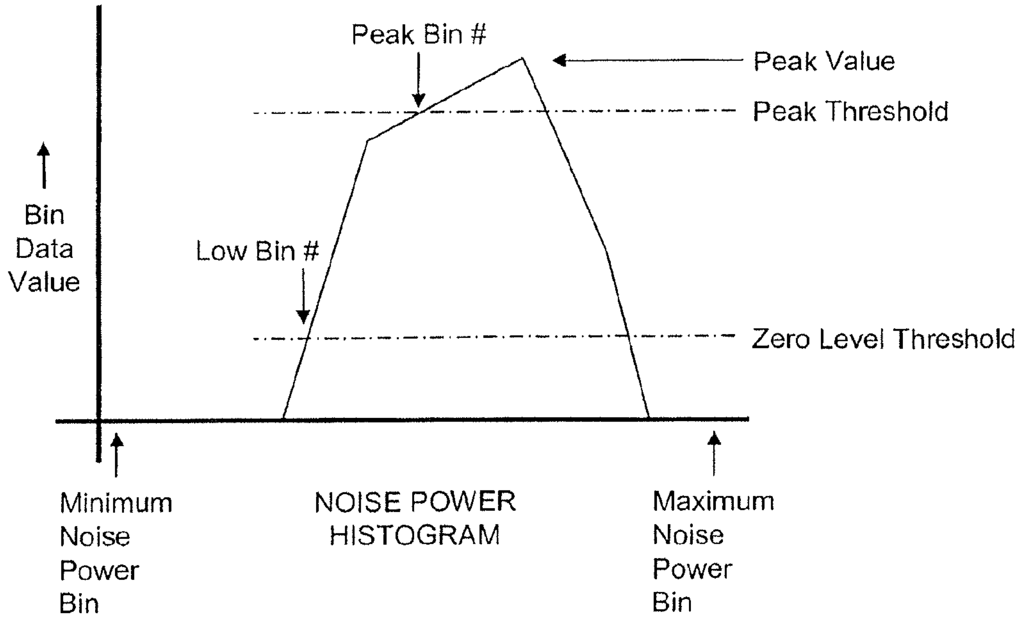
FIG. 10 shows an exemplary Noise Power Histogram describing terms associated with the Find Peak Value, Peak and Zero Bins State.

FIG. 10 illustrates the various elements described above, including the terminology used in the Find Peak Value, Peak and Zero Bins State 730.

Figure 11:
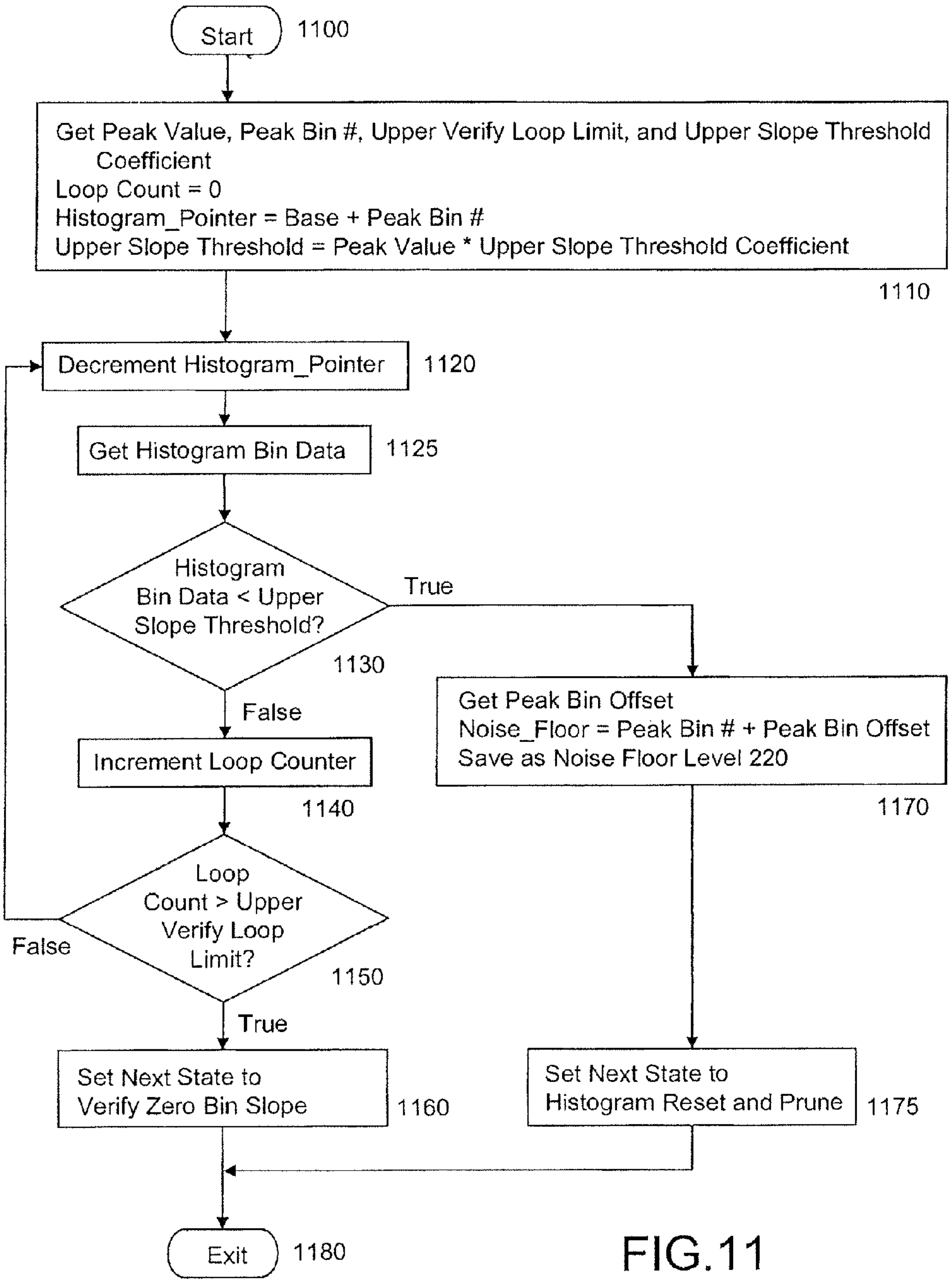
FIG. 11 shows a detailed exemplary Verify Peak Bin Slope State flow diagram.
Figure 12:
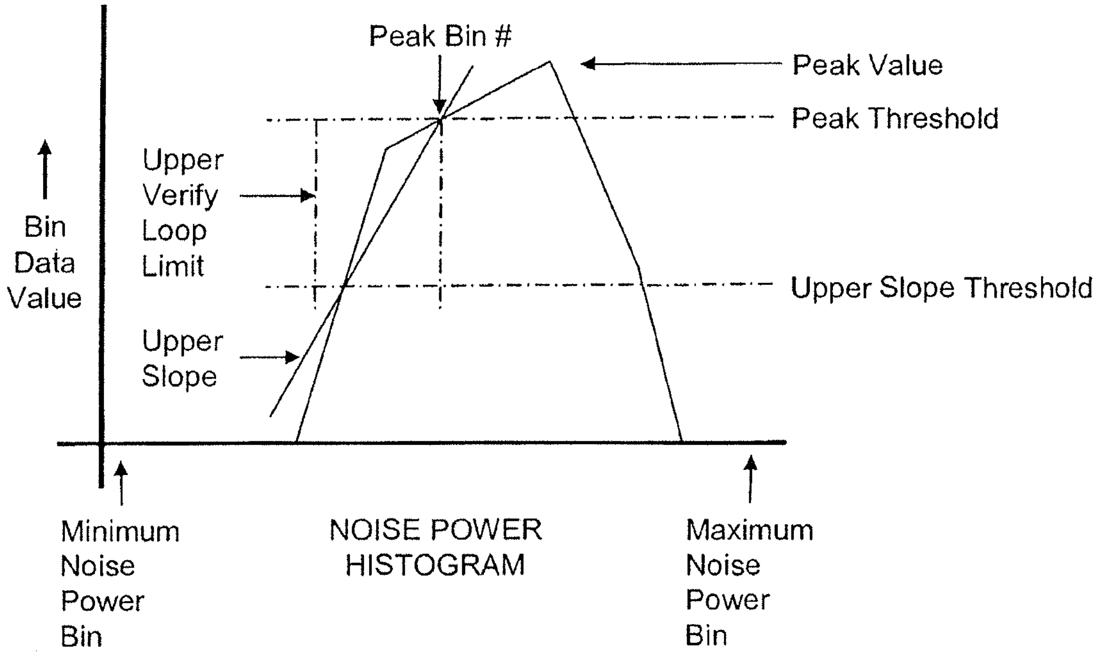
FIG. 12 shows an exemplary Noise Power Histogram describing terms associated with the Verify Peak Bin Slope State.

FIG. 11 depicts one example of Verify Peak Bin Slope State 740. The process starts at step 1100 and proceeds to step 1110 where the Peak Value, Peak Bin #, Upper Verify Loop Limit and Upper Slope Threshold Coefficient are obtained, initializes the Loop Counter to zero, and generates the Histogram_Pointer and Upper Slope Threshold value. Next, the main verification loop is entered, comprising steps 1120 through 1150. A primary objective is verification that the histogram data slope from the Peak Bin # to lower power level bins is steep enough, which indicates that the lower edge of a noise power spectrum has been found and that the Peak Bin # is near the top of the noise power spectrum, indicative of the actual noise floor. Slope=ΔY/ΔX and, in this case, ΔY is the difference in histogram bin data values and ΔX is the difference in histogram bin numbers. ΔY is provided by the Upper Slope Threshold Coefficient and the maximum ΔX is provided by the Upper Verify Loop Limit. Therefore the minimum slope indicative of a noise power spectrum is equal to the Upper Slope Threshold Coefficient divided by the Upper Verify Loop Limit. To verify that the slope from the Peak Bin # is steep enough, loop steps 1120 through 1150 test the bins below the Peak Bin #, up to the Upper Verify Loop Limit, and if the lower bin's data value is less than the Upper Slope Threshold at step 1130, the slope meets or exceeds the minimum slope requirements and step 1170 is executed. Since there may be biases due to the operation of Noise Power Filter 420, a predetermined offset may be added to the Peak Bin # to obtain a more accurate Noise Floor Level 220, which is performed at step 1170. Since the Noise Floor 220 has been found, no further verification is required and step 1175 sets the next state to Histogram Reset and Prune and the process exits at step 1180. Otherwise, if none of the tested bins was less than the threshold at step 1130 and step 1150 terminates the loop (Upper Verify Loop Limit or ΔX, the maximum number of bins to test has been exceeded), the slope was too shallow indicating that the noise floor has not been found, the next state is set to Verify Zero Bin Slope at step 1160, and the process exits at step 1180. FIG. 12 illustrates the various elements described above, including the terminology used in the Verify Peak Bin Slope State 740.

Figure 13:
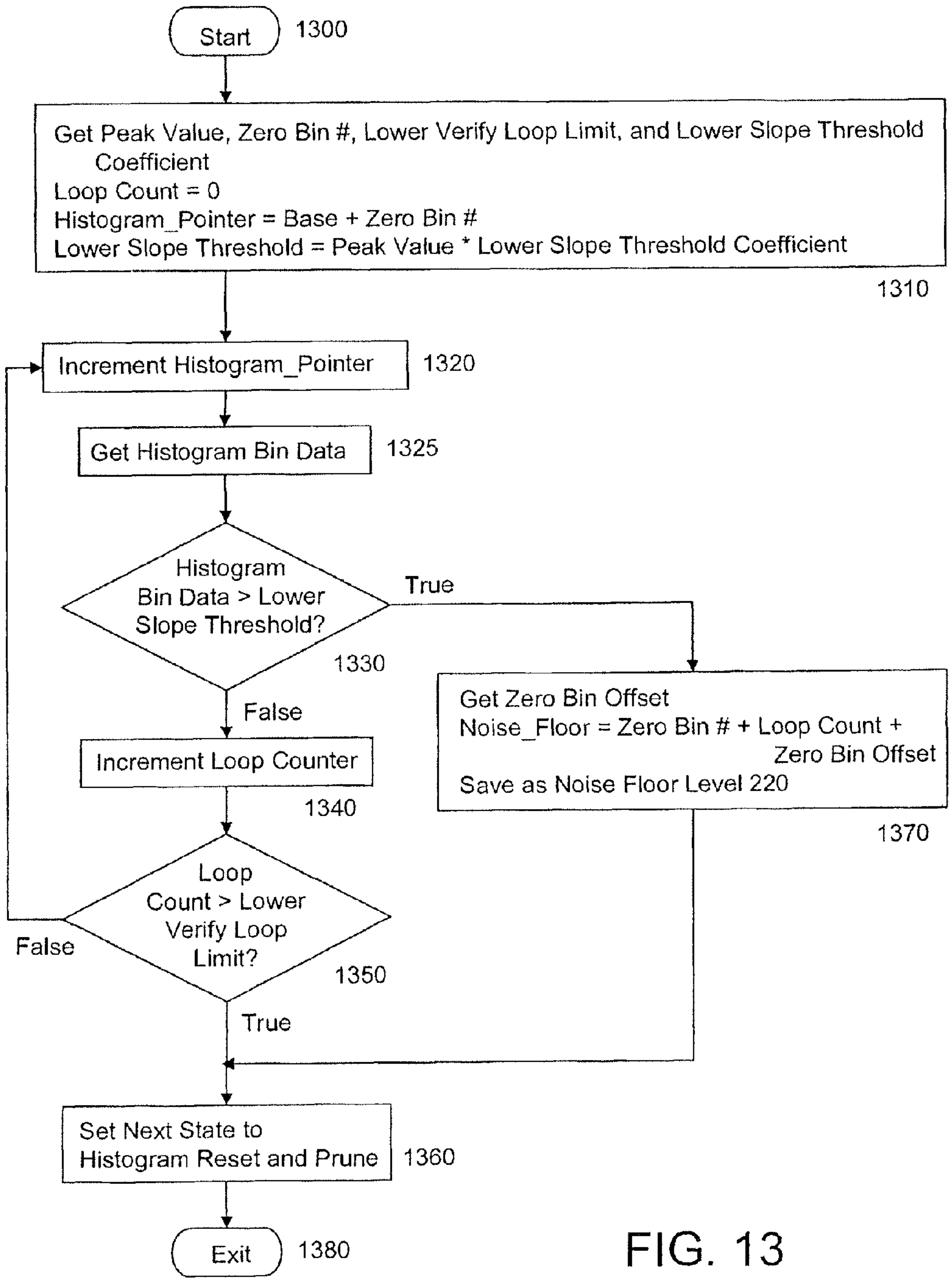
FIG. 13 shows a detailed exemplary Verify Low Bin Slope State flow diagram.

If the Verify Peak Bin Slope failed, there is one more opportunity to identify the noise floor in Verify Low Bin Slope State 750 as shown in FIG. 13. The concept is the same as in the Verify Peak Bin Slope State 740 except here a steep slope at the lower edge of the noise power histogram is sought. The process starts at step 1300 and proceeds to step 1310 where the Peak Value, Zero Bin #, Lower Verify Loop Limit and Lower Slope Threshold Coefficient are obtained, initializes the Loop Counter to zero, and generates the Histogram_Pointer and Lower Slope Threshold value.

Next, the main verification loop is entered, consisting of steps 1320 through 1350. A principle objective is verification that the histogram data slope from the Zero Bin # to higher power level bins is steep enough, which indicates that the lower edge of a noise power spectrum has been found. To verify that the slope from the Zero Bin # is steep enough, loop steps 1320 through 1350 test the bins above the Zero Bin #, up to the Lower Verify Loop Limit, and if the higher bin's data value is greater than the Lower Slope Threshold at step 1330, the slope meets or exceeds the minimum slope requirements and step 1370 is executed. In this case, the Zero Bin # is the lower edge of the noise power spectrum and not near the actual noise floor. The bin that exceeded the threshold test at step 1330 is the closest therefore the Loop Count is added to the Zero Bin # in step 1370. Since there may be biases due to the operation of Noise Power Filter 420, a predetermined offset may also be added to the Zero Bin #+Loop Count to obtain a more accurate Noise Floor Level 220, which is also performed at step 1370. The next state is set to Histogram Reset and Prune State at step 1360, and the process exits at step 1380. Otherwise, if none of the tested bins was greater than the threshold at step 1330 and step 1350 terminates the loop (Lower Verify Loop Limit or ΔX, the maximum number of bins to test has been exceeded), the slope was too shallow indicating that the noise floor has not been found, the next state is set to Histogram Reset and Prune State at step 1360, and the process exits at step 1380.

Figure 14:
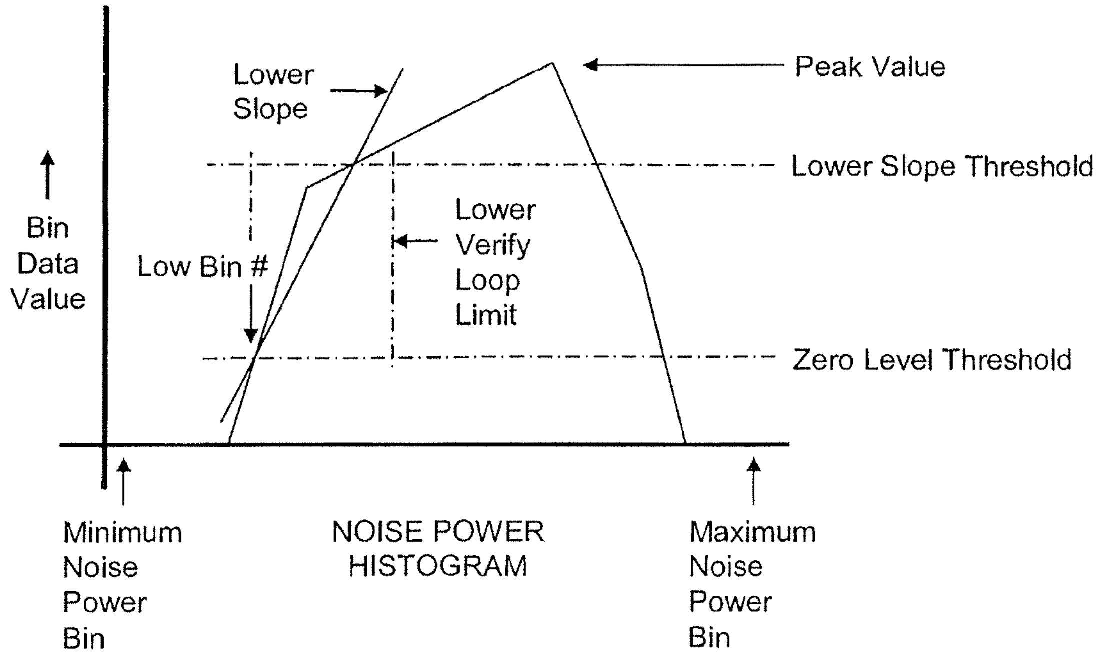
FIG. 14 shows an exemplary Noise Power Histogram describing terms associated with the Verify Low Bin Slope State.

In this case, both verification tests (Verify Peak Bin Slope State 740 and Verify Low Bin Slope State 750) did not identify a noise floor level and Noise Floor Level 220 is not updated, retaining the last valid noise floor level. This situation mainly occurs in "dominant talker" mode with the result being that Noise Floor Level 220 will remain higher than the actual noise floor until the person terminates their constant talking. FIG. 14 illustrates the various elements described above, including the terminology used in the Verify Low Bin Slope State 740.

Additional Descriptions of Certain Aspects of the Invention

Certain embodiments of the invention provide systems, methods and computer readable media comprising data and computer executable instructions for analyzing noise extracted from a signal. In some of these embodiments, the methods comprise obtaining indicia of a noise, estimating noise power from the indicia, accumulating a history of noise power estimations, and calculating a noise floor level from the history of noise power estimations. In some of these embodiments, certain of the indicia are obtained from a microphone. In some of these embodiments, the microphone provides an input signal comprising noise and voice components. In some of these embodiments, certain of the indicia are provided by one or more motion sensors, wherein motion sensors include a tachometer and an accelerometer. In some of these embodiments, the indicia include one or more state indicators. In some of these embodiments, the estimating step is performed using at least one of a half-cycle power estimator and an initial power estimator. In some of these embodiments, the noise power is estimated by calculating at least one of root mean square value, peak value and average signal value of the noise. In some of these embodiments, the noise power is estimated using a slow-attack, fast-release filter. In some of these embodiments, the noise power is estimated using a variable attack and release filter.

In some of these embodiments, the accumulating step includes generating statistics from the history of noise power estimations. In some of these embodiments, the statistics are maintained as a histogram. In some of these embodiments, each element of the histogram has an increment value that is fixed. In some of these embodiments, each element of the histogram has an increment value that is variable and based upon at least one of a frequency, a half-cycle interval and a power level of the noise.

Some of these embodiments further comprise controlling one or more system gain elements based on the calculated noise floor level. In some of these embodiments, controlling the system gain element includes transforming the noise floor level to obtain one or more system gain control signals. In some of these embodiments, controlling the system gain element includes setting at least one system volume. In some of these embodiments, controlling the system gain element includes setting at least one system volume offset. In some of these embodiments, controlling the system gain element includes setting at least one compander knee point. In some of these embodiments, controlling the system gain element includes setting at least one compander compression or expansion ratio. In some of these embodiments, controlling the system gain element includes setting at least one compander compression or expansion ratio offset.

Certain embodiments of the invention provide a signal processing method comprising monitoring the output power of one or more system gain elements over a time interval, and limiting the gain of the system gain element when a product of output power and time exceeds a predefined threshold. In some of these embodiments, the time interval is a sliding time interval. In some of these embodiments, the product is accumulated over the sliding time interval. In some of these embodiments, the step of limiting is performed to maintain the output power below a safe long-term listening level. In some of these embodiments, the limiting step includes generating a history of the output power using a statistics generator, and providing a safe signal for limiting the gain value based on a statistical analysis of the history of the output power.

In some of these embodiments, the calculating step includes using a statistical analyzer to perform a statistical analysis of the history of noise power estimations. In some of these embodiments, the statistical analyzer comprises a state machine.

Certain embodiments of the invention provide a system for analyzing noise extracted from an input signal, comprising a signal having a noise component, a noise extractor configured to estimate power of the noise component, a statistics generator that generates statistics from a series of power estimates obtained from the noise extractor, a statistics analyzer configured to generate a noise floor estimate associated with the signal and based on the statistics.

Certain embodiments of the invention provide a computer-readable medium that stores instructions executable by one or more processing devices to perform a method for analyzing noise extracted from a signal, the method comprising the steps of obtaining indicia of a noise, estimating noise power from the indicia, accumulating a history of noise power estimations, and calculating a noise floor level from the history of noise power estimations.

Although the present invention has been described with reference to specific exemplary embodiments, it will be evident to one of ordinary skill in the art that various modifications and changes may be made to these embodiments without departing from the broader spirit and scope of the invention. For example, linear noise signals may be converted to a logarithmic form to simplify the processing of the signal and to increase computational accuracy. This linear to logarithmic conversion may be accomplished at any number of points in the signal processing path, for example, during the analog to digital conversion process 330, or the processing of fast power estimator 410, noise power filter 420, statistics generator 430, statistics analyzer 440, or noise level post-processor 250. Furthermore, embodiments of the present invention can also be implemented in various ways using any combination of hardware and software, including for example, software running on a personal computer, embedded software running in one or more digital signal processors, microprocessors and/or custom and semi-custom integrated circuits. In certain embodiments, multiple processors and functional elements maybe used and the system can be deployed across a plurality of distinct devices. Certain embodiments of the invention find application in personal computers, personal media players, phones, cordless and wireless phones, electronic gaming systems, in car entertainment systems, microphones for recording use, or any product that uses a microphone, such as personal computers, camcorders, voice recorders, answering machines, hearing aids and so forth. Accordingly, the specification and drawings are to be regarded in an illustrative rather than a restrictive sense.

What is claimed is:

1. A method comprising:

monitoring the output power of a system gain element over a time interval; and limiting the gain of the system gain element when a product of output power and time exceeds a predefined threshold.

2. The method of claim 1, wherein the time interval is a sliding time interval.

3. The method of claim 2, wherein the step of limiting the gain of the system gain element includes delaying changes in the gain of the system gain element to prevent response to transient noise.

4. The method of claim 2, wherein the product is accumulated over the sliding time interval.

5. The method of claim 4, further comprising limiting the gain of the system gain element in response to a safe signal asserted when the product accumulated over the sliding time interval exceeds a safe long term listening level.

6. The method of claim 5, wherein the step of limiting the gain in response to a safe signal includes selecting a gain that reduces output power to a safe listening power level for a recovery time.

7. The signal processing method of claim 1, wherein the step of limiting the gain of the system gain element includes limiting the gain in response to a safe signal generated by a statistics generator based on a statistical analysis of a history of the output power of the system gain element.

8. The method of claim 1, wherein the system gain element produces a plurality of outputs, and wherein the step of limiting the gain of the system gain element includes controlling the gain using a reference signal representative of a power estimate of the plurality of outputs.

9. The method of claim 1, wherein the step of limiting the gain of the system gain element includes controlling the gain using a reference signal representative of a power estimate of an output of the system gain element.

10. The method of claim 9, wherein controlling the gain includes:

comparing the reference signal to a noise floor level to determine whether the output requires noise compensation of the output; and compensating for noise in the output when noise compensation is determined to be required.

11. The method of claim 10, wherein the noise floor level is based on statistics generated from a history of noise power estimations.

12. The method of claim 11, wherein the noise power estimations are based on indicia provided by one or more of a microphone, a motion sensors, a tachometer and an accelerometer.

13. The method of claim 12, wherein the indicia comprise one or more of a voice component and a state indicator.

14. The method of claim 11, wherein the noise power estimations are received from a slow-attack, fast-release filter.

15. The method of claim 11, wherein the noise power estimations are received from a variable attack and release filter.

16. The method of claim 1, wherein limiting the gain of the system gain element includes setting at least one system volume control.

17. The method of claim 1, wherein limiting the gain of the system gain element includes setting at least one of a compander knee point, a compander compression ratio, a compander expansion ratio, a compander compression ratio offset and a compander expansion ratio offset.

18. A system for controlling gain, comprising:

one or more system gain elements each having a variable gain; and a noise level processor configured to control the output power of the one or more system gain elements over a time interval, wherein the noise level processor limits the gains of at least one of the one or more system gain elements when a product of output power and time exceeds a predefined threshold.

19. A computer-readable non-transitory storage medium that stores instructions executable by one or more processing devices, the instructions causing the one or more processing devices to:

monitor the output power of a system gain element over a time interval; and limit the gain of the system gain element when a product of output power and time exceeds a predefined threshold.

* * * * *